TRANSISTOR AND HOUSING ASSEMBLY

Filed Dec. 7, 1955

INVENTOR.
Dale T. Kelley
BY Mueller & Aichele
Attys.

July 28, 1964 D. T. KELLEY 3,142,791

TRANSISTOR AND HOUSING ASSEMBLY

Filed Dec. 7, 1955 3 Sheets-Sheet 2

INVENTOR.
Dale T. Kelley
BY Mueller & Aichele
Attys.

July 28, 1964 D. T. KELLEY 3,142,791

TRANSISTOR AND HOUSING ASSEMBLY

Filed Dec. 7, 1955 3 Sheets-Sheet 3

INVENTOR.

Dale T. Kelley

BY Mueller & Aichele

Attys.

United States Patent Office 3,142,791

Patented July 28, 1964

3,142,791

TRANSISTOR AND HOUSING ASSEMBLY

Dale T. Kelley, Phoenix, Ariz., assignor to Motorola, Inc., Chicago, Ill., a corporation of Illinois Filed Dec. 7, 1955, Ser. No. 551,498
1 Claim. (Cl. 317—234)

The present invention relates to semiconductor assemblies, and more particularly to an improved diode or transistor unit of the alloyed-junction type which is capable of relatively high power usages. Although the invention will be described herein principally as directed to a transistor, it will be evident as the description proceeds and it is to be distinctly understood that the scope of the invention also can embrace power diodes and other semiconductor assemblies.

Reference is made to subsequently filed continuing applications which have issued on October 30, 1962, as Patent Nos. 3,060,553, and 3,061,766.

The alloyed-junction transistor comprises a semiconductor crystal wafer composed, for example, of germanium or silicon or of any other suitable semiconductor material. The crystal wafer has a base region of one conductivity type and has electrodes of a selected alloying impurity material fused to the opposite faces thereof to be directly opposite one another. The regions of the crystal wafer respectively adjacent the fused electrode become melted during the fusing operation and upon recrystallization these regions contain traces of the alloying material and are designated the "alloyed regions." The alloying material is chosen so that the alloyed regions adjacent the respective electrodes will be of the opposite conductivity type to that of the base region so that p-n junctions are formed between the alloyed regions and the base region. In a usual transistor of this type, there is provided a pair of these junctions essentially parallel to one another and separated by the base region.

It is usual for most present day alloyed junction transistors to have a semiconductor crystal composed of n-type germanium, and to have indium (which is a p-type impurity) for the alloying metal. However, the alloyed junction transistor can use any suitable type of semiconductor crystal and the crystal may be either n-type or p-type. Moreover, any suitable impurity material can be used for the alloying electrodes so long as it is capable of imparting a conductivity type to the recrystallized alloyed regions that are opposite to the conductivity type of the base region of the crystal.

The power handling capabilities of the alloyed-junction transistor are limited by excessive internal heating, which heating produces distortion of the signals translated by the unit at relatively high power. Therefore, to produce a high power transistor of this type, it is necessary to provide some means for holding the temperature of the junction down to a certain maximum in the power range in which the unit is to be operated. Most of the deleterious internal heating is developed at the collector junction, and attempts have been made to decrease the temperature of this junction by using a strip or ribbon connection to the collector electrode so as to provide a relatively large heat dissipating surface. It has also been proposed that the enclosure for the unit be filled with a cooling fluid and connected to a heat sink which conducts away the heat absorbed by the fluid.

A more successful construction is one in which the collector electrode of the semiconductor wafer is mounted directly on a solid metal body of high heat conductivity, with this body being affixed to the chassis of the equipment in which the transistor is used so that the chassis may function as a heat sink. With this arrangement, the metal body serves as a conduit or heat conductor for conducting heat away from the colletcor junction, and it also serves as an electrical terminal for the collector electrode. It is with this latter type of construction that the present invention is concerned.

One problem that is encountered in the fabrication of power transistors of the type described immediately above is that of sealing the enclosure or container to the solid metallic heat conductor body referred to above. The obvious method of sealing the enclosure consists in welding or soldering it to the heat conductor body. However, soldering is objectionable because of the extremely high heat conductive path to the collector junction provided by the heat conductor. Therefore, any heat generated during the soldering operation is quickly conducted to the collector junction with resulting damage to the semiconductor crystal. Soldering, also, is generally objectionable due to the residue of flux and gas left inside the enclosure and which has a degrading effect on the semiconductor. However, this latter objection although objectionable enough is not as serious as the fact that the base operates in reverse during the soldering operation and conducts heat most efficiently to the collector junction with resulting damage thereto.

Welding is equally impractical because of the difficulty of welding to a thick plate of material having high thermal conductivity, and this is the situation when it is attempted to weld the enclosure to the solid heat conductor described above. Welding also produces objectionable heat which is conducted to the collector junction in the manner described above with resulting damage to the crystal, and welding also releases undesirable gases within the enclosure.

It is a general object of the present invention to provide an improved high power semiconductor unit of the type described in the preceding paragraph, which unit may be constructed in a simple and commercially practical manner so as to be economical in its construction and which unit exhibits desired characteristics for high power usages.

Another object of the invention is to provide such an improved semiconductor unit which is constructed so that its enclosure or cover may be attached in an effective and permanent manner and with no degrading effect on the electrical characteristics of the unit.

Another object of the invention is to provide an improved method for fabricating such a high power semiconductor unit in which an enclosure for the unit is attached to a heat conductor supporting member in a quick, simple and inexpensive manner that has no adverse effect whatever on the electrical characteristics of the semiconductor crystal included in the unit.

Yet another object of the invention is to provide such an improved method whereby the enclosure of the unit is attached to the base in an effective and permanent manner that releases no heat, flux, gases or foreign matter within the enclosure during the sealing operation.

A feature of the invention is the provision of a high-power semiconductor unit in which a semiconductor crystal is supported on a metallic heat conductor body in intimate heat conductive relation therewith, and in which a simple clip structure is incorporated to permit electrical connections to be effected to the various electrodes of the semiconductor in a simplified and easy to construct manner.

Another feature of the invention is the provision of a high-power semiconductor unit of the type described above in which the cover or enclosure for the unit is sealed to the heat conductor body by a swaged joint so as to form an effective and permanent unitary structure.

Another feature of the invention is the provision of an improved method for fabricating such a semiconductor unit in which the cover or enclosure for the unit is swaged to the heat conductor body in such a manner that no heat, flux, or other foreign matter is generated during the sealing process or enters the enclosure at any time.

The above and other features of the invention which are believed to be new are set forth with particularity in the appended claims. The invention itself, however, together with further objects and advantages thereof, may best be understood by reference to the following description when taken in conjunction with the accompanying drawings in which:

It should be noted that the views of FIGS. 2–9 are enlarged for purposes of clarity and, of course, are not actual representations of the dimensions of the physical unit.

The invention provides a power amplifier transistor unit comprising a solid metallic heat conductor supporting body of relatively high heat conductivity and having a substantially flat upper surface with an outwardly extending flat-topped integral pedestal thereon. A semiconductor crystal wafer is provided having a base region of one conductivity type and having a pair of opposite faces. A pair of pellets of a selected impurity metal for the crystal wafer are fused to the opposite faces of the wafer, and these pellets have respective alloyed regions associated therewith of a conductivity type opposite to that of the base region and which alloyed regions penetrate into the crystal wafer. The alloyed regions are separated by the base region of the wafer with a pair of separated p-n junctions being formed between the base region and respective ones of the alloyed regions. A thin tin ring is fused to one face of the crystal simultaneously with the fusion of the pellets, and this ring functions as a base connection. The wafer is supported on the pedestal of the heat conductor with one of the fused pellets being soldered to the pedestal and in electrical and heat conductive contact therewith. The heat conductor also has a pair of apertures therein adjacent the pedestal with first and second electrical conductors supported therein in insulating relationship with the heat conductor. A metallic clip is affixed to the semiconductor crystal making electrical contact with the base ring, and this clip extends around a portion of the periphery of the crystal to form a base electrode in relatively large area ohmic contact with the crystal. The clip also has an elongated leg portion which extends to one of the conductors. A resilient strip is supported on the other of the conductors and is connected to the other pellet on the opposite side of the semiconductor crystal. Finally, a metal can or container for enclosing the crystal is supported on the heat conductor supporting body with the rim of this can extending into the heat conductor in bonded swaged relation therewith.

Figures 1, 10:
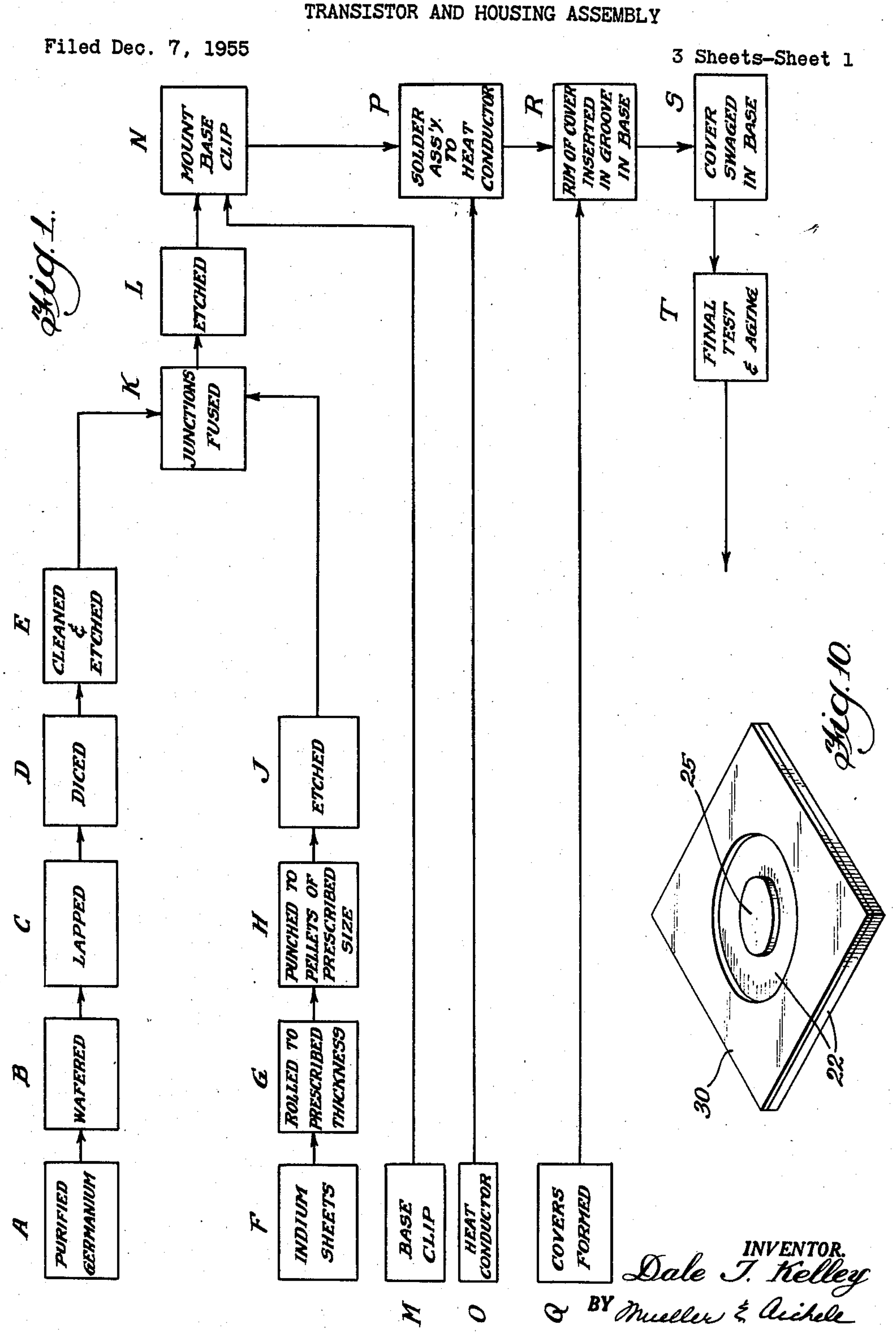
FIG. 1 is a flow chart showing the construction of the semiconductor unit of the present invention.
FIG. 10 shows the crystal with the emitter and base connections fused thereto.

With reference to FIG. 1, the fabrication of the high power semiconductor assembly of the invention will now be described. A crystal of suitable semiconductor material such as n-type germanium that has been purified to a resistivity of the order of 2.0±0.5 ohms/centimeter is provided, (Step A). The provision of such a crystal of the desired degree of purity and exhibiting the desired conductivity type characteristic is now well understood by the art and a description of the various steps necessary for such production is deemed to be unnecessary. The crystal is cut into relatively large wafers (Step B) by means for example, of a thin diamond or silica wheel; and each of these wafers is then lapped in any suitable commercial lapping machine (Step C).

It is desirable that the crystal wafers be oriented and cut so that their faces are parallel to the Miller (111) crystallographic planes so as to assist in the formation of flat bottomed cavities and planar junctions for improved performance. This process is disclosed and claimed in copending application S.N. 409,329, filed February 10, 1954, in the name of William E. Taylor, and assigned to the present assignee.

The large wafer is then diced (Step D) into smaller wafers, and each of the smaller wafers comprises a semiconductor crystal for the individual units. The latter wafers have a size, for example, of the order of ¼ x ¼ x 008″.

As shown in Step E, the crystal is then cleaned and etched. This may be effected in the following solution:

| | Cc. |
|---|---|
| Distilled water | 1 |
| 70% Nitric acid ($HNO_3$) | 5 |
| 52% Hydrofluoric acid (HF) | 5 |

The formation of the indium pellets (which, in this example, are in the form of discs) is illustrated by Steps F–J of FIG. 1. The discs may conveniently be formed by rolling an indium sheet to a prescribed thickness and punching the sheet to provide the discs of a desired size. These discs, for example, may have a diameter of the order of .187 inch for the collector electrode and .125 inch for the emitter electrode. The indium discs may then be etched in the following solution:

| | Millilitres |
|---|---|
| Distilled water | 360 |
| 70% Nitric Acid ($HNO_3$) | 20.5 |
| 48% Hydrofluoric Acid (HF) | 8.0 |
| 30% Hydrogen Peroxide ($H_2O_2$) | 2.0 |

The next step "K" in the process, comprises fusing the indium discs to the opposite sides of the germanium wafer. This may be carried out in by means of the boat or jig described in copending application 459,045 filed September 29, 1954, in the name of Matt F. Schmich and assigned to the present assignee. That application discloses a boat which supports the indium discs on the opposite sides of the germanium wafer for simultaneous fusion and which boat is constructed to confine the molten indium on all sides during the fusion process so that the shape of the resulting electrodes may be fully controlled for shallow penetration and large area wetting which (as described fully in the Schmich application) is desirable in high-power transistors. Simultaneous with this fusing operation a thin element 30 of pure tin (see FIG. 10) is fired on to the surface of the crystal around the periphery thereof to form a connector for the subsequent base electrode which will be described. This element assures a positive low resistance contact between the base electrode and the crystal to provide uniform current distribution in the final assembly.

After the fusing operation, the assembly is etched as indicated in Step L. The solution previously mentioned herein for etching the indium pellets may be used for this purpose, and this solution etches away and removes the indium film from the surface of the germanium and cleans the surface. The unit is cleaned in this solution at around 70° F. for about 30 seconds, and it is then washed in distilled water and dried in air. This cleaning of Step L assures that there will be no short circuiting of the emitter and collector electrodes across the junctions due to a conductive film of indium or indium salts over the surface of the crystal wafer that usually forms during the fusion step.

Figures 2, 3, 4, 5:
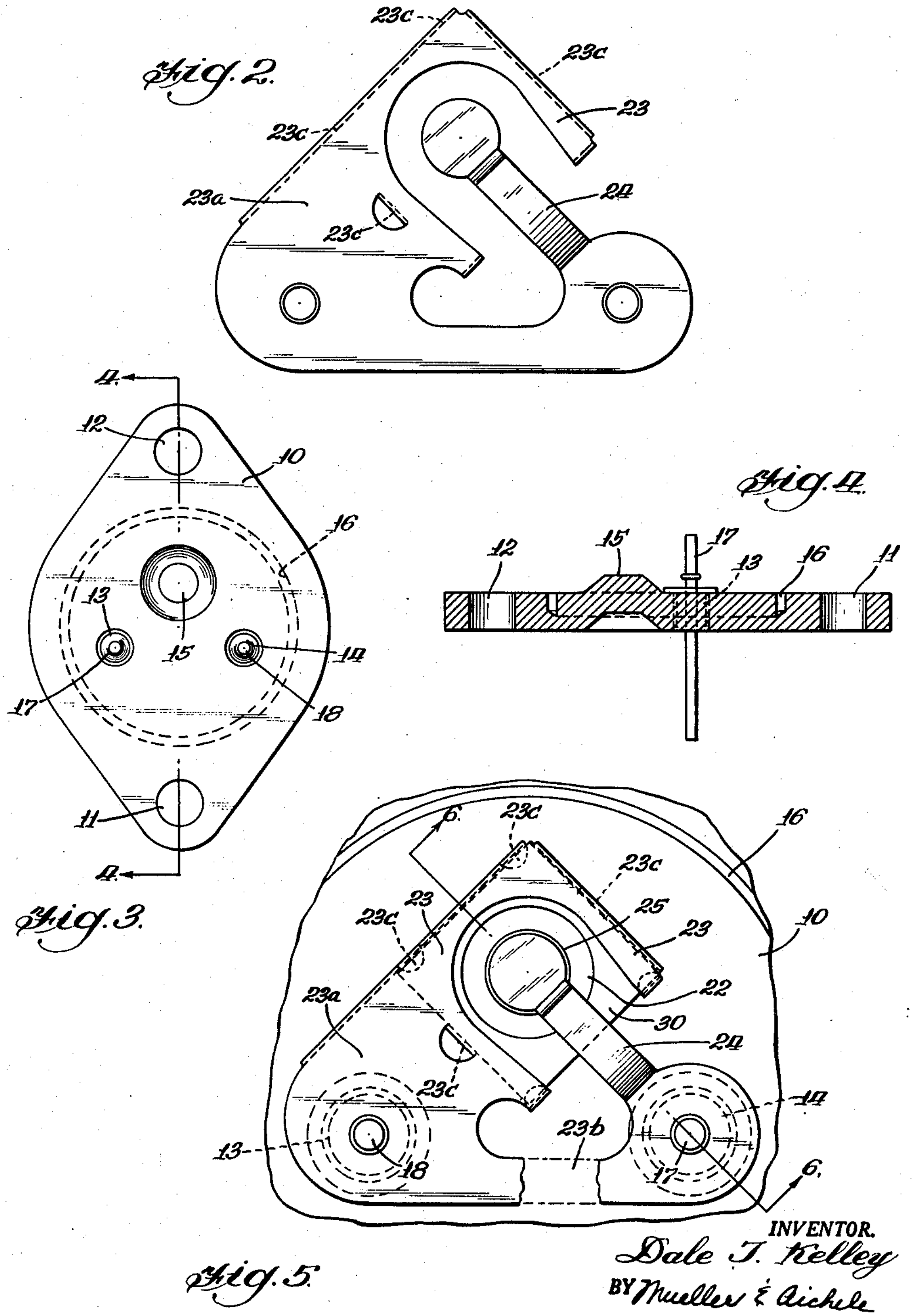
FIG. 2 is one component of the unit of one embodiment of the invention.
FIG. 3 is a plan view of the solid metallic heat conductor supporting body of the semiconductor assembly.
FIG. 4 is a sectional view taken along the line 4—4 of FIG. 3.
FIG. 5 is a fragmentary plan view showing the heat conductor supporting body of the assembly, and the mounting of the semiconductor crystal thereon with its connection to various terminals.
Figure 6:
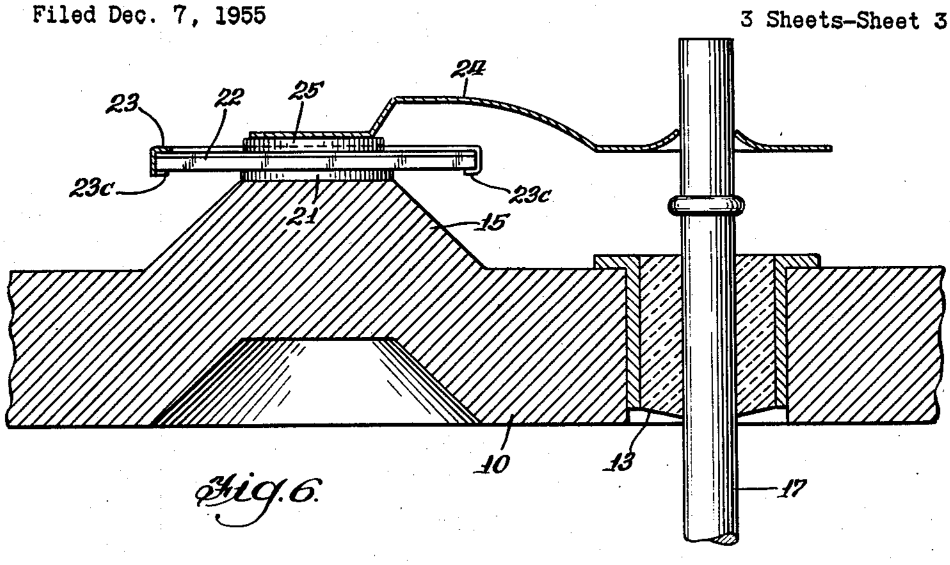
FIG. 6 is a sectional view taken along the line 6—6 of FIG. 5.
Figure 7:
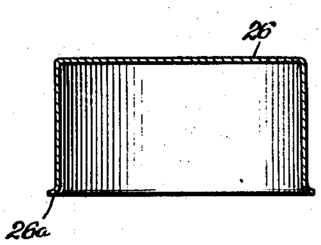
FIG. 7 is an elevational view of the cover or enclosure of the semiconductor unit.
Figure 8:
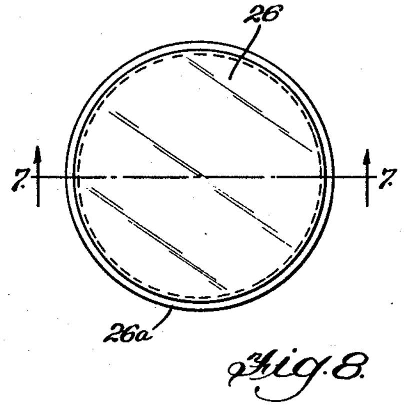
FIG. 8 is a plan view of the enclosure.

The next step is to form the base clip which is illustrated in FIG. 2, this step is indicated "M" in FIG. 1. This clip is fabricated preferably by a punching operation and it has a grooved U-shaped section 23 that fits over the peripheral tin member 30 that is fired to the crystal during the fusion step, as noted; and it also has an arm **23*a* that forms the base connection to the final assembly. The clip also has an arm 24 that forms the emitter connection, and which is later disconnected from the base sections 23 and 23*a*, as will be described. The clip is preferably composed of brass or copper and is plated with silver and then gold flashed to permit fluxless soldering and subsequent electrolytic soldering. The base clip (Step N) is placed on the crystal 22 from Step L so that the grooved section 23 surrounds three sides of the semiconductor, and the clip has a series of fingers 23*c* that are bent under the crystal wafer to hold the clip in place, these fingers being shown in FIG. 6. The base clip is then soldered to the tin ring 30** which is fused to the rim of the semiconductor as mentioned previously herein.

The heat conductor body is then formed as shown in Step O. The structural configuration of the heat conductor is shown in FIGS. 3 and 4. A previously noted, the function of this body is to form a collector connection to one of the indium electrodes of the semiconductor and to conduct heat away from the collector electrode. The heat conductor, therefore, is composed of a material such as copper having high electrical and heat conductivity, and also one that may be readily soldered or otherwise fastened to the collector electrode. Also, as will be described, since the enclosure for the unit is later swaged to the heat conductor, the heat conductor must also be susceptible to a swaging operation. Relatively soft copper having, for example, a hardness of Rockwell 19–20 on the B-scale has been found well suited for this purpose. However, the heat conductor may be composed of brass, aluminum or any other suitable material.

The heat conductor is designated 10 in FIGS. 3 and 4 and it may be made by a process which simultaneously shapes the body into the desired ellipsed configuration with opposite parallel flat surfaces, punches a pair of mounting holes 11 and 12 and a pair of connector holes 13 and 14, embosses a flat-topped pedestal 15, and coins a groove 16 around holes 13 and 14. This may be done by means of a progressive die in a punch press in accordance with known tool and die procedures.

A pair of standoff insulated conductors 17 and 18 of known construction are mounted respectively in apertures 13 and 14 as shown, for example, in FIGS. 3 and 4. These conductors usually consist of a central stud of conductive material surrounded by a glass tubular insulator and a steel bushing, which bushing fits into the apertures 13 and 14.

The groove 16 receives the cover or enclosure in a subsequent swaging operation and, as previously pointed out, this groove may be coined and it has been found that a sawing operation is also desirable by means, for example, of a circular saw. The groove is of the order of seventy-three thousandths of an inch deep, and it appears from present experience that it should be held to fairly close tolerances as to depth and inside diameter. The enclosure should abut against the inner wall of the groove so as to assure a firm air-tight seal and to prevent distortion of the enclosure during the swaging operation.

The flat-topped pedestal 15 of the heat conductor is plated with silver followed by a gold flash to permit fluxless soldering. The assembly from Step N is then placed on the heat conductor with the collector electrode 21 resting on pedestal 15, with the arms **23*a* and 24 of the base clip resting respectively on the standoff conductors 17 and 18 in the manner shown in FIGS. 5 and 6, and with the crystal 22 extending essentially parallel to the top surface of heat conductor 10. Solder washers are interposed between the base clip and the standoff conductors 17 and 18, and the unit is placed in a furnace which simultaneously solders the base clip to the two standoff insulators, solders the collector electrode 21 to the pedestal 15, and the arm 24 of the base clip to the emitter electrode 25. The connection 23*b* (FIG.5) between the emitter lead 24 and the base lead 23*a* is then removed by clipping or burning or by any other suitable means. The soldering operation (Step P) and the removal of portion 23*b*** are preferably carried out in an inert atmosphere to obviate the need for flux for the soldering, and yet to be sure that there is no oxidation of the various metal parts that are to be soldered.

The cover or enclosure 26 for the unit (FIGS. 7 and 8) is formed at Step Q of FIG. 1, and this enclosure may be preferably made of copper and may be a seamless copper can fabricated by the usual known drawing process. The cover also has a bent-over rim **26*a* which has been found to facilitate the swaging process. This rim forms a lip that provides a mechanically stronger and better closure between the cover and the heat conductor 10**.

The enclosure 26 is attached to the heat conductor 10 by placing its rim **26*a* in groove 16** (Step R). The cover may be held down by a spring while a swaging tool concentric to the cover forces the metal of the heat conductor radially inward to effect the seal. The swaging tool may be a cylinder of hardened steel with a wedge shaped edge so arranged that metal is moved in and down but not outward. This results in a sealed structure in which the rim extends into the heat conductor in a firm rigid and permanent seal. This latter step is shown as Step S of FIG. 1.

Figure 9:
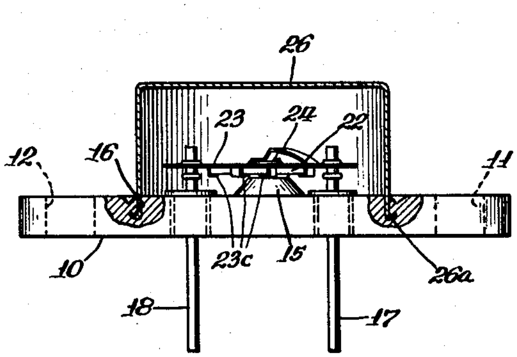
FIG. 9 is an elevational view partly in section of a power transistor constructed in accordance with the invention.

A cross sectional view of the completed unit is shown in FIG. 9. The unit is then passed to final test and aging as shown in Step T of FIG. 1.

The assembly may conveniently be mounted on a metal chassis by means of the mounting holes 11 and 12, so that the chassis forms a heat sink for the heat generative at the collector junction of crystal wafer 22. The heat conductor 10 forms an extremely high heat conductive path from the collector electrode to the chassis so that the unit may be operated at relatively high power level without undue heating of the collector junction.

The simplified base clip construction facilitates greatly the manufacturing process. Moreover, by attaching enclosure 26 to heat conductor 10 in the described swaged manner, the units may be constructed without any damage or degradation to the semiconductor. Also, as previously noted, no deleterious gases are released in the enclosure during the sealing operation, which is a common occurrence in many prior art sealing processes.

The invention provides, therefore, a method whereby high-power transistors or other types of semiconductor units may be constructed in a relatively simple and inexpensive manner. Moreover, the resulting assembly is effective and permanent in its construction, is capable of efficient high power operation, and does not suffer any deterioration to its electrical characteristics during the fabricating process.

Power transistors constructed in accordance with the present invention have exhibited the following characteristics:

| | |
|---|---|
| **Maximum Ratings:** | |
| Collector D.C. voltage ________ v. | −16 |
| Instantaneous peak collector voltage referred to emitter ________ v. | −36 |
| Collector D.C. current ________ a. | −2 |
| Collector dissipation at heat conductor temperature 80° C. ________ w. | 10 |
| **Grounded Emitter:** | |
| Input impedance (F=1 kc., $V_c$=12 v., $I_e$=0.5 a.) with output shorted ________ ohms | 15 |
| Current gain (F=1 kc., $V_c$=12 v., $I_e$=0.5 a.) with output shorted ________ ohms | 30 |
| Collector cutoff current ($V_c$=16 v.) | |
| (*a*) 25° C. junction temp ________ ma. | <2 |
| (*b*) 90° C. junction temp ________ ma. | <10 |
| Minimum collector—emitter voltage ($I_c$=2 a.) ________ v. | <2 |
| Frequency cutoff (power gain down 3 db as compared with gain at 1 kc.) ________ kc. | >10 |
| **Typical Operation, Grounded Emitter, Class A Single Ended, Heat Conductor Temp. 80° C. (Max.):** | |
| Collector D.C. voltage ________ v. | −12 |
| Collector D.C. current ________ ma. | −800 |
| Base D.C. current ________ ma. | 30 |
| Load impedance ________ ohms | 25 |
| Input impedance ________ do. | 25 |
| Power output ________ w. | 3 |
| Power gain ________ db. | 25 |
| **Typical Operation, Grounded Emitter, Class AB Push-Pull, Heat Conductor Temp. 80° C. (Max.):** | |
| Collector D.C. voltage ________ v. | −12 |
| Collector D.C. current, zero signal, each unit ________ ma. | −250 |
| Base D.C. current, zero signal; each unit ________ ma. | 7.5 |
| Collector D.C. current for 10 watts output; each unit ________ ma. | −800 |
| Base D.C. current for 10 watts output; each unit ________ ma. | 30 |
| Load impedance, collector to collector ________ ohms | 16 |
| Load impedance, base to base ________ do. | 100 |
| Unbypassed resistance in emitter lead of each unit ________ ohms | 0.5 |
| Total power output ________ w. | 10 |
| Power gain ________ db. | 18 |
| Total harmonic distortion ________ % | <10 |
| **Dimensions of Constructed Unit:** | |
| Heat conductor **10** ________ | 1.53″ x 1.00 x .12″ |
| Pedestal **15** ________ | 16″ di. x .10″ |
| Enclosure **26** ________ | 79″ di. x .41″ |

I claim:

In a semiconductor device having a mounting portion therefor and a plurality of conductor pins upstanding from one side thereof, semiconductor and connector structure for said device including in combination a substantially square semiconductor portion having at least two contacts on one side and having one contact on the other side thereof, and two connector portions with one of said connector portions having an apertured portion at one end and having a substantially square portion at the other end which fits over said semiconductor portion and has tabs thereon which confine said semiconductor portion in a position substantially coextensive with the substantially square connector portion during the assembly of the semiconductor and connector portions, said square portion of said connector portion being in a fused connection with the semiconductor portion, and the other of said two connector portions having an apertured portion and having a contact portion which is in a fused connection with a contact on the semiconductor portion, with said combination structure being mounted on the device mounting portion and on the upstanding conductor pins and being mechanically and electrically secured thereto.

References Cited in the file of this patent

UNITED STATES PATENTS

| | | |
|---|---|---|
| 1,571,907 | McClanahan | Feb. 2, 1926 |
| 2,426,289 | Wallace et al. | Aug. 26, 1947 |
| 2,584,461 | James et al. | Feb. 5, 1952 |
| 2,813,326 | Liebowitz | Nov. 19, 1957 |
| 2,836,878 | Shepard | June 3, 1958 |
| 2,846,625 | Gustafson et al. | Aug. 5, 1958 |
| 2,854,610 | Waters et al. | Sept. 30, 1958 |
| 2,887,628 | Zierdt | May 19, 1959 |
| 2,928,030 | Lighty | Mar. 8, 1960 |
| 2,955,242 | Parziale | Oct. 4, 1960 |